US010425150B1

(12) United States Patent
Earnhardt, Jr. et al.

(10) Patent No.: US 10,425,150 B1
(45) Date of Patent: Sep. 24, 2019

(54) REMOTELY-MANAGED AIRCRAFT RF COMMUNICATION NETWORK, DEVICE, AND METHOD

(71) Applicant: Rockwell Collins, Inc., Cedar Rapids, IA (US)

(72) Inventors: Neil J. Earnhardt, Jr., Melbourne, FL (US); Scott F. Bauler, Melbourne, FL (US); William T. Greenleaf, Indialantic, FL (US); Joel Michael Wichgers, Urbana, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/213,578

(22) Filed: Jul. 19, 2016

(51) Int. Cl.
*H04B 7/185* (2006.01)
*H05K 7/14* (2006.01)
*B64C 1/36* (2006.01)

(52) U.S. Cl.
CPC ........... *H04B 7/18508* (2013.01); *B64C 1/36* (2013.01); *H05K 7/14* (2013.01)

(58) Field of Classification Search
CPC .............. H04B 7/18506; H04B 1/0007; H04B 1/3822; H04B 7/18508; H04L 2012/4028; H04W 84/005; H04W 84/06
USPC ................................. 455/431, 66.1, 98, 345
See application file for complete search history.

(56) References Cited

U.S. PATENT DOCUMENTS

| | | | | |
|---|---|---|---|---|
| 2010/0202557 A1* | 8/2010 | Harris | ................... | H04B 1/0007 375/295 |
| 2011/0022249 A1* | 1/2011 | Bibaut | ..................... | G01S 7/003 701/3 |
| 2012/0295537 A1* | 11/2012 | Zaruba | ............... | H04B 7/18506 455/12.1 |
| 2014/0153674 A1* | 6/2014 | Stratigos, Jr. | ........... | H04L 27/06 375/340 |
| 2016/0112151 A1* | 4/2016 | Chedas | ................. | H04J 3/0605 370/503 |
| 2016/0267042 A1* | 9/2016 | Dantin | .................. | G06F 13/409 |

OTHER PUBLICATIONS

"Cabin Standard Enclosures—Modular Rack Principle (MRP)", Jun. 22, 2012, ARINC Specification 836, Aeronautical Radio, Inc., Annapolis, Maryland.

* cited by examiner

*Primary Examiner* — Philip Sobutka
(74) *Attorney, Agent, or Firm* — Daniel M. Barbieri; Donna P. Suchy; Angel N. Gerdzhikov

(57) ABSTRACT

An aircraft remote network, device, and method are disclosed. The network may include a central data management unit (CDMU) and one or more aircraft systems, where each system may include an antenna and one or more units, through which radio frequency (RF) signals are transmitted and/or received. The device could receive a RF signal from an external source via the antenna, convert the signal to data, and provide the data to the CDMU; and receive data from the CDMU, convert the data to an RF signal, and provide the RF signal to the external source via the antenna, where the distance between the antenna and the device is less than the distance between the device and the CDMU.

20 Claims, 11 Drawing Sheets

REMOTELY-MANAGED AIRCRAFT RF COMMUNICATION NETWORK, DEVICE, AND METHOD

BACKGROUND

Aircraft may be equipped with communication, navigation, and surveillance (CNS) systems. With respect to communication systems, the aircraft may be equipped with more than one communication system through which a pilot and/or passengers may communicate with those not located inside the aircraft. Three of these communication systems that are commonly used today include a high frequency (HF) system(s) operable in the frequency band between 2 and 30 megahertz (MHz), very high frequency (VHF) system(s) operable between 118 MHz and 137 MHz, and satellite communication (SATCOM) system(s) operable in L-band, Ku-band, or Ka-band.

Referring now to FIGS. 1 and 2, an exemplar of an aircraft communication network 100 is illustrated. The network 100 may include one or more remote HF systems 110 and 112; one or more remote VHF systems 114, 116, and 118; a remote SATCOM system 120; and an audio management unit (AMU) 122. In some embodiments, the network 100 may be configured with two remote HF systems, three remote VHF systems, and one remote SATCOM system. In some embodiments, the network 100 may be configured with a different number of HF systems, VHF systems, and/or SATCOM systems. In some embodiments, one or more of these systems could be absent.

The HF1 and HF2 systems 110 and 112 could include a plurality of units configured to facilitate two-way, long-range communications between the aircraft and, for example, one or more other aircraft and/or one or more ground stations. In some embodiments, the HF1 system 110 could include an HF1 XCVR 110-1, an HF2 coupler 110-2, and an HF1 antenna 110-3. The HF2 system 112 could include a HF2 XCVR 112-1, an HF2 coupler 112-2, and the HF2 antenna 110-3. As shown, the HF1 system 110 and the HF2 system 112 may employ the same HF1/HF2 antenna 110-3.

As observed, coax cable could be a communication medium through which RF signals may be transmitted and received between the XCVRs 110-1 and 112-1, the couplers 110-2 and 112-2, and the antenna 110-3. In some embodiments, one or more amplifiers (e.g., a high power amplifier) could be included in the HF1 and HF2 systems 110 and 112 and connected to the coax cable to overcome cable losses, where a cable loss could be a loss of a signal's power that may be proportional to the length of the coax cable and/or attributable to one or more cable connectors employed along the cable.

The VHF1, VHF2, and VHF3 systems could include a plurality of units configured to facilitate two-way, short-range communications between the aircraft and, for example, one or more other aircraft and/or one or more ground stations. In some embodiments, the VHF1 system 114 could include a VHF1 XCVR 114-1 and a VHF1 antenna 114-2; the VHF2 system 116 could include a VHF2 XCVR 116-1 and a VHF2 antenna 116-2; and the VHF3 system 118 could include a VHF3 XCVR 118-1 and a VHF3 antenna 118-2.

As observed, RF signals may be transmitted and received between the XCVRs 114-1, 116-1, and 118-1 and their respective antennas 114-2, 116-2, and 118-2 through coax cable. In some embodiments, one or more amplifiers could be included in the VHF1, VHF2, and VHF3 systems 114, 116, and 118 and connected to the coax cable to overcome cable losses.

The remote SATCOM system 120 could include a plurality of units configured to facilitate two-way, satellite communications between the aircraft and, for example, one or more other aircraft and/or one or more ground stations. In some embodiments, the remote SATCOM system 120 could include a satellite data unit (SDU) 120-1 and a SATCOM antenna 120-2. As observed, RF signals may be transmitted and received between the SDU 120-1 and the antenna 120-2 through coax cable (or a plurality of parallel coax cables). In some embodiments, one or more amplifiers could be included in the SATCOM system 120 and connected to the coax cable (or a plurality of parallel coax cables) to overcome cable losses.

In the field of aviation, many components may be referred to as line replaceable units (LRU), portable modules designed to be removed and installed with relative ease. For the purpose of illustration, the electronic LRUs for the network 100 could include the XCVRs 110-1, 112-1, 114-1, 116-1, and 118-1; the couplers 110-2 and 112-2; the SDU 120; and the AMU 122. LRUs allow aircraft maintenance personnel to quickly remove and replace electronic equipment (i.e., those LRUs in which a plurality of electronic printed circuit boards could be installed) of aircraft systems, thereby facilitating maintenance.

ARINC 600 standard entitled "Air Transport Avionics Equipment Interfaces" is an aviation standard in which aircraft electronic equipment racking, power, and environmental packaging or form factors for LRUs have been developed and includes connector standards, mating, and support tray hold down techniques; this reference is incorporated herein in its entirety. ARINC 600 sets forth a definition, guidance, and appraisal for design and acceptance of the mechanical, electrical, and environmental interfaces between LRUs and the racks or cabinets in which they are installed. Owners and/or operators of aircraft benefit from cost savings of standardization by allowing for simpler upgrades of systems and faster replacement times of LRUs that are fundamental for the operation of an aircraft. The environmental packaging or form factor specific to each LRU may be stated in an ARINC standard applicable to the LRU to which the LRU has been functionally or operationally designed. For example, the XCVRs 114-1, 116-1, and 118-1 may be designed to the standards published in ARINC 716-11 entitled "Airborne VHF Communications Transceiver", or ARINC 750-4 entitled "VHF Data Radio," both of which are known to those skilled in the art.

To facilitate maintenance, electronic LRUs may be installed on support trays affixed to shelves of an electronics rack 124 in a centralized location(s) colloquially referred to as an electronic or equipment bay (E/E bay) 126. Referring now to FIG. 3 an exemplary shape and installation configuration of the electronics rack 124 is shown. As observed, the electronics rack 124 provides a centralized location where a plurality of LRUs (shown with dotted and diagonal fill patterns) of a plurality of aircraft systems may be installed on support trays 128 affixed to shelves 130 of an electronics rack 124. As observed, XCVRs 110-1, 112-1, 114-1, 116-1, and 118-1, SDU 120-1, and AMU 122 (shown with the dotted fill patterns).

The ambient temperature within an E/E bay may become hot due to a buildup of heat collectively generated and dissipated by the plurality of centrally located electronic LRUs. Without adequate ventilation and/or cooling air, one or more LRUs could easily exceed maximum operating temperatures to which they are designed and certified, and/or could operate at higher temperatures which may result in reduced LRU reliability. ARINC 600 includes standards for the application of forced cooling air to the LRUs installed on the rack(s). Form factors of LRUs may include openings to one or more sides of the LRUs, thereby exposing the internal components such as printed circuit boards to the forced air and providing adequate ventilation for the dissipation of heat from those components.

Because the LRU's may be centrally located, wires and other transmitting means of signal and data are routed from many locations in the aircraft to the electronics rack 124. As such, the lengths of the coax cable may vary greatly among systems. For example, compare exemplary lengths of coax cables of an Airbus A320 aircraft that could be configured with the HF1 system 110, the HF2 system 112, and the VHF1 system 114. The HF1 system 110 could employ a total of approximately 107 feet of coax cable (comprised of two cables connected together at a connector having approximate lengths 40 feet and 67 feet) running in between the XCVR 110-1 and the coupler 110-2, and the HF2 system 112 could employ a total of approximately 103 feet of coax cable (comprised of two cables connected together at a connector having approximate lengths 37 feet and 66 feet), whereas the VHF1 system 114 could employ a total of approximately 29 feet of coax cable (comprised of two cables having approximate lengths 4 feet and 25 feet and connected together at a connector) running in between the XCVR 114-1 and the antenna 114-2. Depending on the type of cable employed, the weight of coax cable may vary between five and fourteen pounds per one-hundred feet. For the HF1 system 110, the approximate weights attributable to the coax cable could range between 5.35 and 15 lbs., whereas the VHF1 system 114 could range between 1 and 4 lbs. Also, heavier cable could require hardware for attaching the cable and/or cable harness made up a more than one wire as well as a cable outing requiring a larger bending radius.

While the use of LRUs and a centralized location facilitates aircraft maintenance, some of wiring connected to the LRUs may have to travel from other locations in the aircraft. If an LRU is a unit of a communications, navigation, and/or surveillance system which employs an antenna, relatively heavy coaxial (coax) cables may be utilized to provide a transmission path for radio frequency (RF) signals. If the distance of the cable run is relatively long, not only does weight of the aircraft increase but also heavier, more powerful amplifiers have to be used to overcome a loss of signal power caused by coax cable propagation.

SUMMARY

Embodiments of the inventive concepts disclosed herein are directed to an aircraft remote network, device, and method for communication, navigation, and/or surveillance systems. The aircraft remote network may assist in a reduction of aircraft weight attributable to a reduction in cable weight and cable losses.

In one aspect, embodiments of the inventive concepts disclosed herein are directed to a remote network of an aircraft. The network may include a centralized data management unit (CDMU) and one or more aircraft communication, navigation, and/or surveillance systems. In some embodiments, the CDMU could include data and/or digitalized audio. Each of these systems may include an antenna and one or more remote radio units through which radio frequency (RF) signals are transmitted and/or received.

In a further aspect, embodiments of the inventive concepts disclosed herein are directed to a device employed in the remote aircraft network. The device may include the unit configured to perform the method in the paragraph that follows.

In a further aspect, embodiments of the inventive concepts disclosed herein are directed to a method employed by a remote aircraft network device. When properly configured, the device could receive a RF signal from an external source via the antenna, convert the signal to data, and provide the data to the CDMU; and receive data from the CDMU, convert the data to an RF signal, and provide the RF signal to the external source via the antenna, where the distance between the antenna and the device is less than the distance between the device and the CDMU.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

In the following description, several specific details are presented to provide a thorough understanding of embodiments of the inventive concepts disclosed herein. One skilled in the relevant art will recognize, however, that the inventive concepts disclosed herein can be practiced without one or more of the specific details or in combination with other components. In other instances, well-known implementations or operations are not shown or described in detail to avoid obscuring aspects of various embodiments of the inventive concepts disclosed herein.

Figure 1:
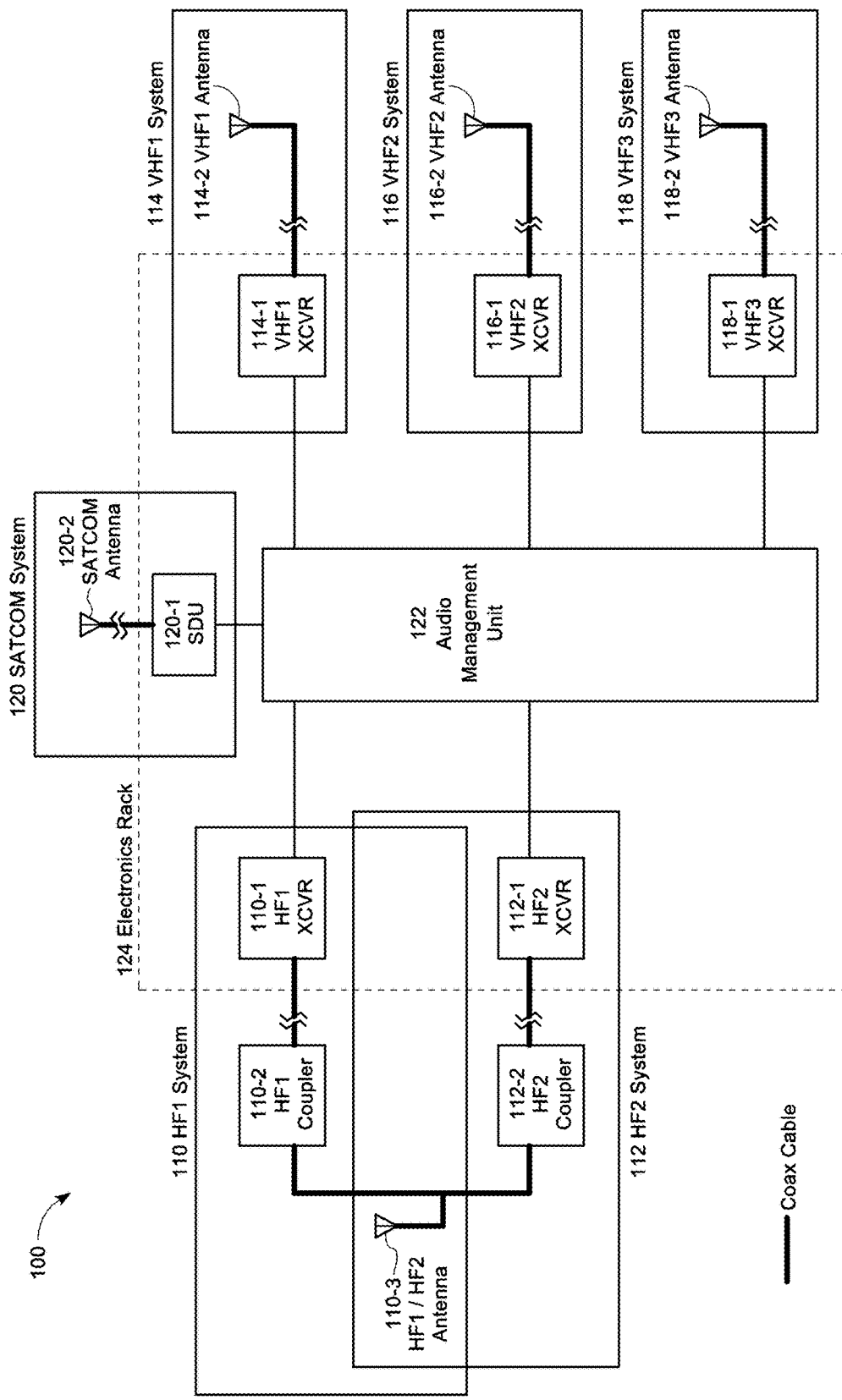
FIG. 1 depicts a functional block diagram of a centralized communication network.
Figure 2:
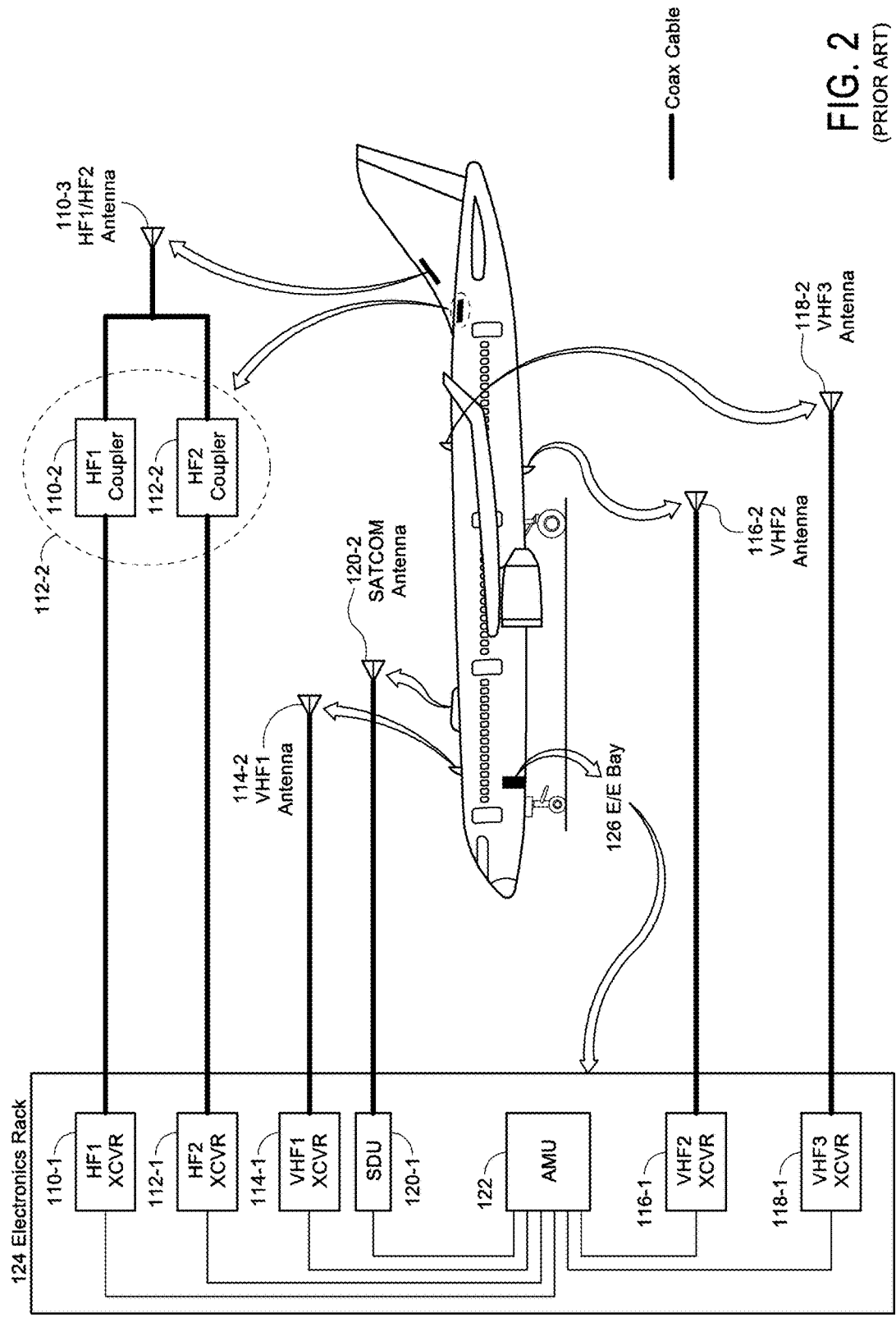
FIG. 2 depicts an aircraft configured with the centralized communication network of FIG. 1.
Figure 3:
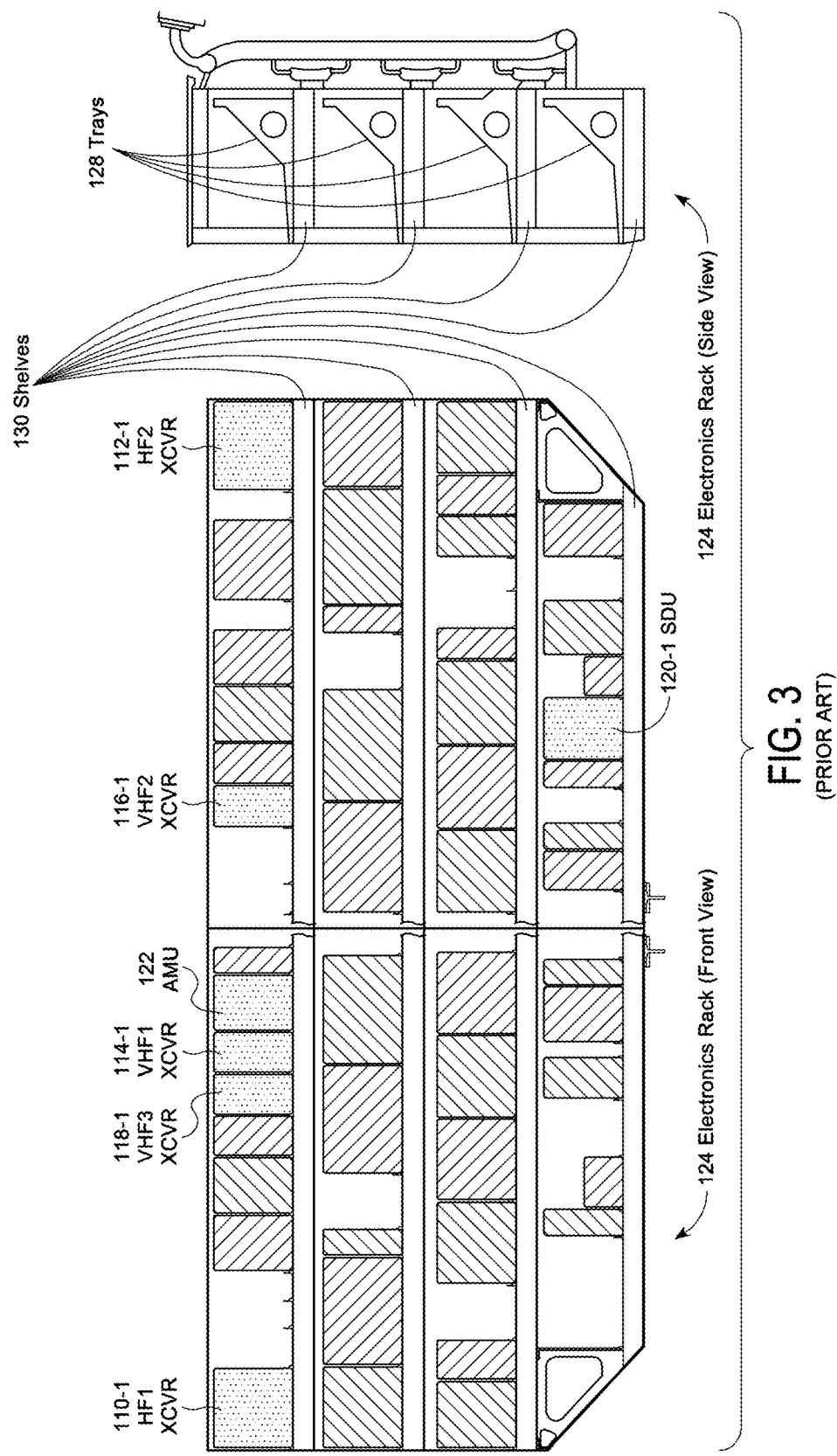
FIG. 3 depicts a centrally-located electronics rack in an electronic or equipment bay (E/E bay) of the aircraft of FIG. 2.
Figure 4A:
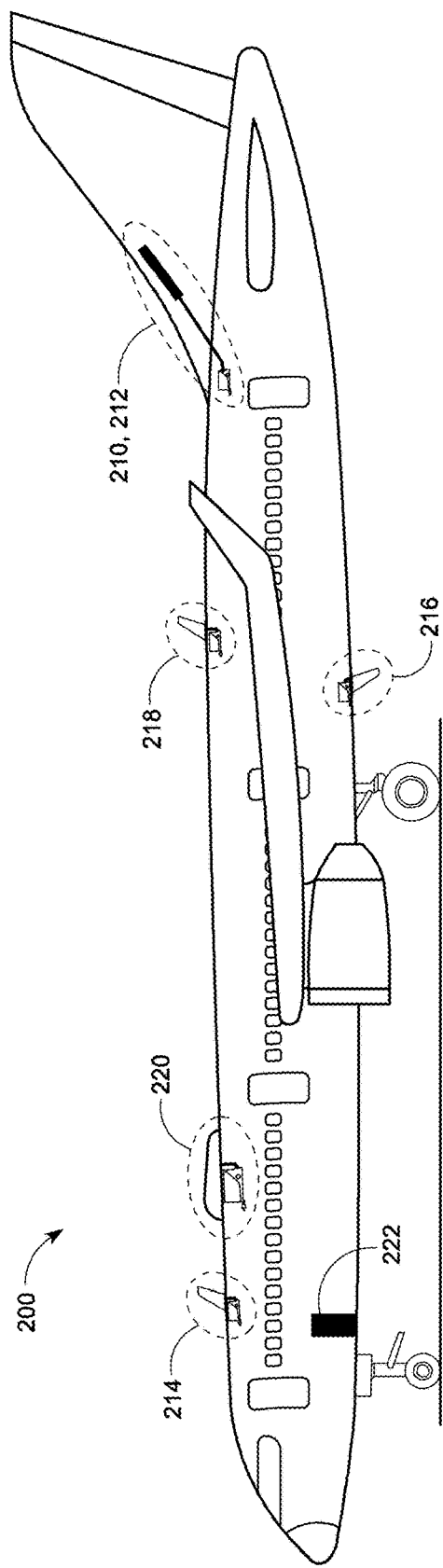
FIG. 4A depicts an aircraft configured with a remote communication network according to the inventive concepts disclosed herein.
Figure 4B:
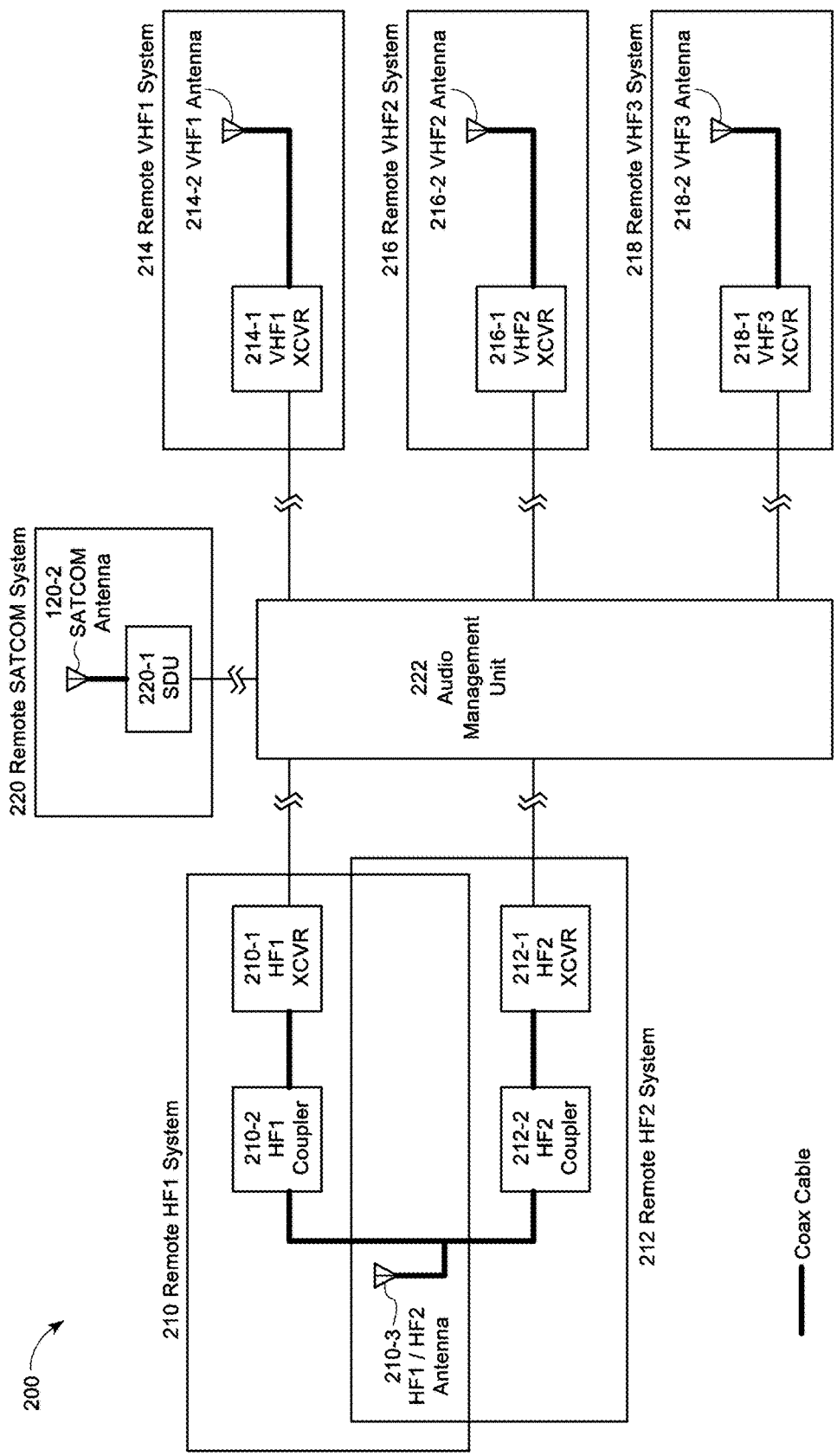
FIG. 4B depicts a functional block diagram of the remote communication network of FIG. 4A.

Referring now to FIGS. 4A-4B, an embodiment of an aircraft remote communication network 200 suitable for implementation of the techniques described herein includes one or more remote high frequency (HF) systems 210 and 212; one or more remote very high frequency (VHF) systems 214, 216, and 218; a remote satellite communication (SATCOM) system 220; and an audio management unit (AMU) 222 in an aircraft that could be configured with an electronics rack 224 located inside an E/E bay 226. Although the following discussion will be drawn to the aircraft remote communication network 200 employing one or more remote communication systems, the inventive concepts disclosed herein are not limited to such network.

The remote HF1 and HF2 systems 210 and 212 could include a plurality of units configured to facilitate two-way, long-range communications between the aircraft and, for example, one or more other aircraft and/or one or more ground stations. In some embodiments, the remote HF1 system 210 could include an HF1 transmitter/receiver or transceiver (XCVR) 210-1, an HF1 coupler 210-2, and an HF1 antenna 210-3. The remote HF2 system 212 could include a HF2 XCVR 212-1, an HF2 coupler 212-2, and the HF2 antenna 210-3. As shown, the remote HF1 system 210 and the remote HF2 system 212 may employ the same HF1/HF2 antenna 210-3.

In some embodiments, the XCVRs 210-1 and 212-1 could receive HF frequency data representative of an HF tuning frequency from the AMU 222 to which the XCVRs 210-1 and 212-1 may be tuned. In some embodiments, the XCVRs 210-1 and 212-1 could provide the HF frequency data to the respective couplers 212-1 and 212-2 which, upon receiving, match the antenna 210-3 to the respective tuning frequency.

In some embodiments, the XCVRs 210-1 and 212-1 configured with a digital-to-analog converter (DAC) and an analog-to-digital converter (ADC) could receive communications data representative of HF voice/data communications from the AMU 222, convert the digital communication data into radio frequency (RF) signals representative of the communications data with a DAC, and transmit the RF signals to a receiver external to the aircraft via the respective couplers 210-2 and 212-2 and the antenna 210-3. In some embodiments, the XCVRs 210-1 and 212-1 may bypass the respective couplers 210-2 and 212-2 and transmit the RF signals to the external receiver via the antenna 210-3.

Likewise, XCVRs 210-1 and 212-1 could receive RF signals representative of HF voice/data communications provided by a transmitter external to the aircraft via the antenna 210-3 and the respective couplers 210-2 and 212-2, convert the RF signals to communications data representative of voice/data communications with an ADC, and provide the communications data to the AMU 222. In some embodiments, the RF signals provided by the external transmitter and received by the XCVRs 210-1 and 212-1 via the antenna 210-3 may bypass the respective coupler 210-2 and 212-2. As shown, a communication medium through which the RF signals may be transmitted and received may be a coaxial (coax) cable.

The remote VHF1, VHF2, and VHF3 systems could include a plurality of units configured to facilitate two-way, short-range communications between the aircraft and, for example, one or more other aircraft and/or one or more ground stations. In some embodiments, the remote VHF1 system 214 could include a VHF1 XCVR 214-1 and a VHF1 antenna 214-2; the remote VHF2 system 216 could include a VHF2 XCVR 216-1 and a VHF2 antenna 216-2; and the remote VHF3 system 218 could include a VHF3 XCVR 218-1 and a VHF3 antenna 218-2.

In some embodiments, the XCVRs 214-1, 216-1, and 218-1 could receive VHF frequency data representative of a VHF tuning frequency from the AMU 222 to which the XCVRs 214-1, 216-1, and 218-1 may be tuned. In some embodiments, the XCVRs 214-1, 216-1, and 218-1 could receive communications data representative of VHF voice/data communications from the AMU 222, convert the digital communication data into RF signals representative of the communications data with a DAC, and transmit the RF signals to a receiver external to the aircraft via the respective antennas 214-2, 216-2, and 218-2. As shown, a communication medium through which the RF signals may be transmitted and received between the XCVRs 214-1, 216-1, and 218-1 and the respective and antennas 214-2, 216-2, and 218-2 may be a coax cable.

Likewise, XCVRs 214-1, 216-1, and 218-1 could receive RF signals representative of VHF voice/data communications provided by a transmitter external to the aircraft via the antennas 214-2, 216-2, and 218-2, convert the RF signals to communications data representative of voice/data communications with an ADC, and provide the communications data to the AMU 222.

The remote SATCOM system 220 could include a plurality of units configured to facilitate two-way, satellite communications between the aircraft and, for example, one or more other aircraft and/or one or more ground stations. In some embodiments, the remote SATCOM system 220 could include a satellite data unit (SDU) 220-1 and a SATCOM antenna 220-2.

In some embodiments, the SDU 220-1 could receive SATCOM frequency data representative of a SATCOM tuning frequency from the AMU 222 to which the SDU 220-1 may be tuned. In some embodiments, the SDU 220-1 could receive communications data representative of SATCOM voice/data communications from the AMU 222, convert the digital communication data into RF signals representative of the communications data with a DAC, and transmit the RF signals to a receiver external to the aircraft via the antenna 220-2 and a satellite(s). Likewise, the SDU 220-1 could receive RF signals representative of SATCOM voice/data communications provided by a satellite(s) and/or a transmitter external to the aircraft via the antenna 220-2, convert the RF signals to communications data representative of the SATCOM voice/data communications with an ADC, and provide the communications data to the AMU 222. As shown, a communication medium through which the RF signals may be transmitted and received between the SDU 220-1 and the antenna 220-2 may be a coax cable.

The AMU 222 could include any unit configured to facilitate two-way communications between the aircraft and, for example, one or more other aircraft and/or one or more ground stations. In some embodiments, the AMU 222 could receive frequency data representative of one or more tuning frequencies selectable from one or more frequency tuning devices for one or more of the remote HF1 and HF2 systems 210 and 212; the remote VHF1, VHF2, and VHF3 systems 214, 216, and 218; and/or the remote SATCOM system 220.

In some embodiments, the AMU 222 could receive communications data representative of voice/data communications originating from a source within the aircraft. In some embodiments, the AMU 222 could provide the communications data to receiving unit such as, but not limited to, a cockpit speaker or a pilot's headset through which a pilot may aurally receive voice transmissions made from an external source.

Some advantages and benefits of the inventive concepts disclosed herein are shown in FIGS. 5 through 8, illustrating how an aircraft may be configured with a communication network utilizing the inventive concepts disclosed herein. As disclosed, electronic LRUs that receive and transmit RF signals may be remotely located from an electronics rack and installed adjacent to the antenna through which the RF signals are received and transmitted; that is, the locations of the electronic LRUs are antenna-based. This could result in lower RF cable losses, a reduced requirement for amplification, and/or lower heat dissipation, allowing the packaging or form factors of the electronic LRUs to remain the size pursuant to an applicable ARINC standard to which the LRU has been operationally designed or reduced while still meeting the operational capabilities pursuant to an applicable ARINC standard; smaller LRUs may reduce the weight of the aircraft.

Figure 5:
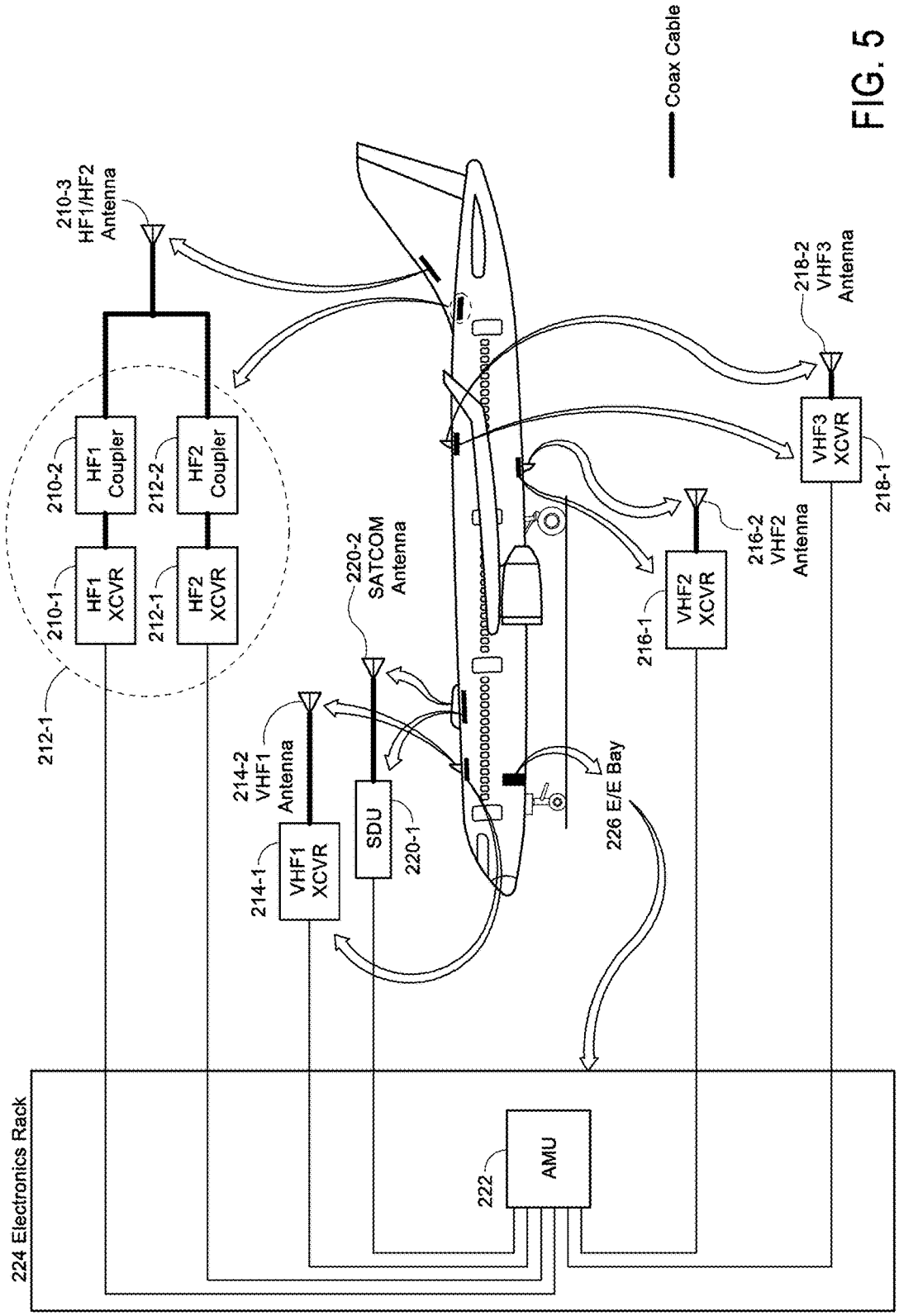
FIG. 5 depicts an aircraft configured with units of the remote communication network of FIG. 4B.

Referring now to FIG. 5, the installation locations of the XCVR 210-1 and the coupler 210-2 of the HF1 system 210 and the XCVR 212-1 and the coupler 212-2 of the HF2 system 212 are adjacent to the installed location of the antenna 210-3. Similarly, the installation locations of the XCVR 214-1, XCVR 216-1, and XCVR 218-1 are adjacent to the installation location of their respective antennas 214-2, 216-2, and 218-2. Likewise, the installation location of the SDU 220-1 is adjacent to the installation location of the antenna 220-2.

Figure 6A:
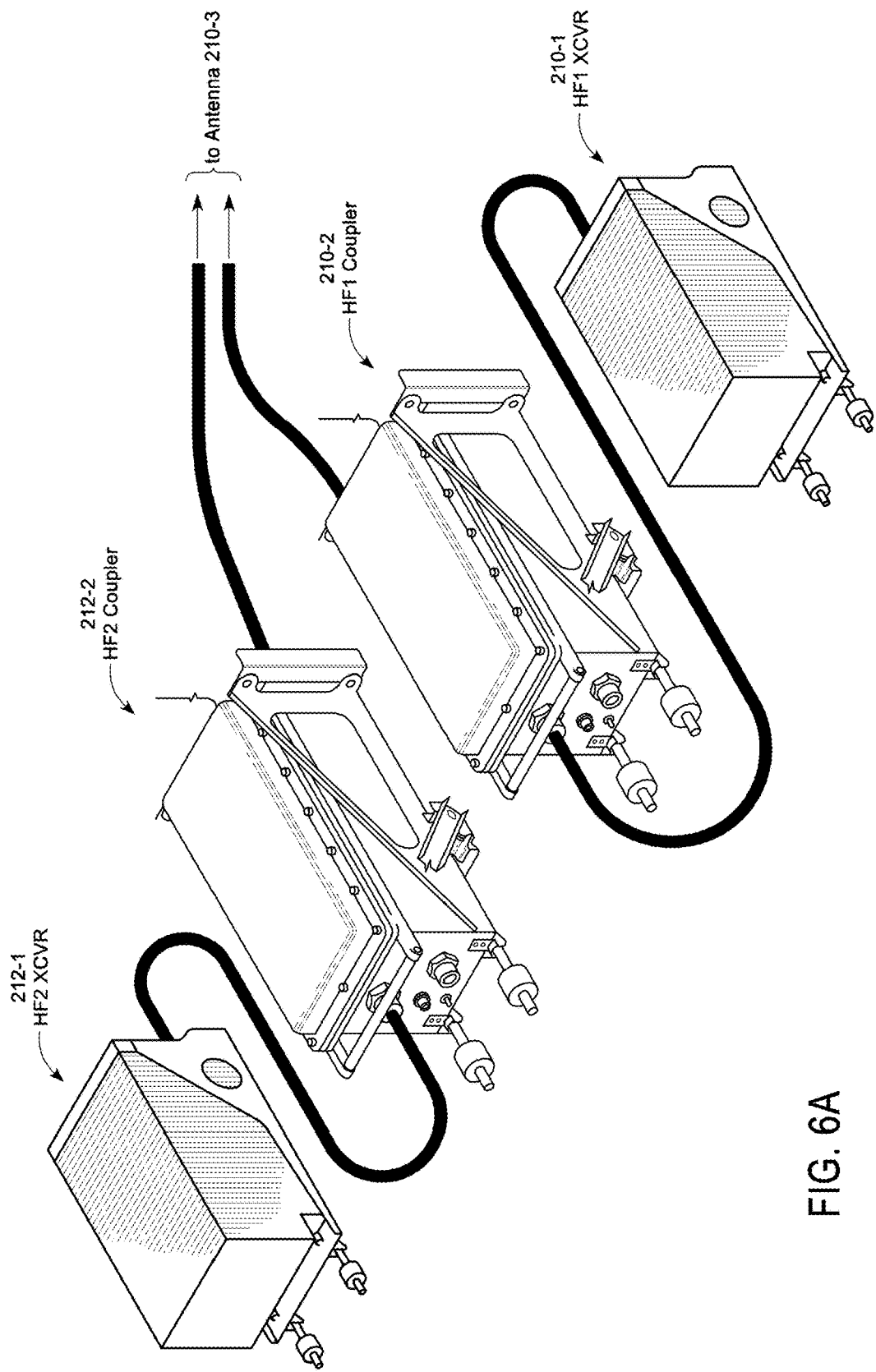
FIG. 6A depicts an exemplary embodiment of a configuration of units employed in remote HF communication systems.

Referring now to FIG. 6A, exemplary configurations of the antenna-based installation of the XCVRs 210-1 and 212-1 and couplers 210-2 and 212-2 at the top of the fuselage and adjacent to the empennage are illustrated. Here, the distance between the antenna and the XCVRs 210-1 and 210-2 is less than the distance between these LRUs and the AMU 222 located in the E/E bay 226. As a result, the antenna-based installation of the XCVRs 210-1 and 210-2 and couplers 210-2 and 212-2 minimize the length of coax cable and cable losses, eliminating a need for amplifiers and more than one cable for the transmission of RF signals; additionally, smaller and lighter wires capable of permitting the transmission of digital communications data representative of HF voice/data communications may run between the E/E bay 226 and these LRUs.

In some embodiments, XCVRs 210-1 and 210-2 and couplers 210-2 and 212-2 may be arranged side-by-side and installed in trays mounted to a supporting structure (not shown). In some embodiments, these LRUs may be designed to meet the operational capabilities pursuant to an applicable ARINC standard specifying the ARINC 600 packaging or form factor for installation in an ARINC 600 electronics rack. In some embodiments, these LRUs may be designed to meet the operational capabilities pursuant to an applicable ARINC standard but not comply with the ARINC 600 packaging or form factor stated therein and/or requirements for installation in an ARINC 600 electronics rack; that is, the LRU designed to meet the operational capabilities pursuant to an applicable ARINC standard may be designed to be smaller than specified therein, thereby reducing the weight of the aircraft. In some embodiments, the LRU may be designed to conform with ARINC Specification 836 entitled "Cabin Standard Enclosures—Modular Rack Principle," a reference is incorporated herein in its entirety.

Figure 6B:
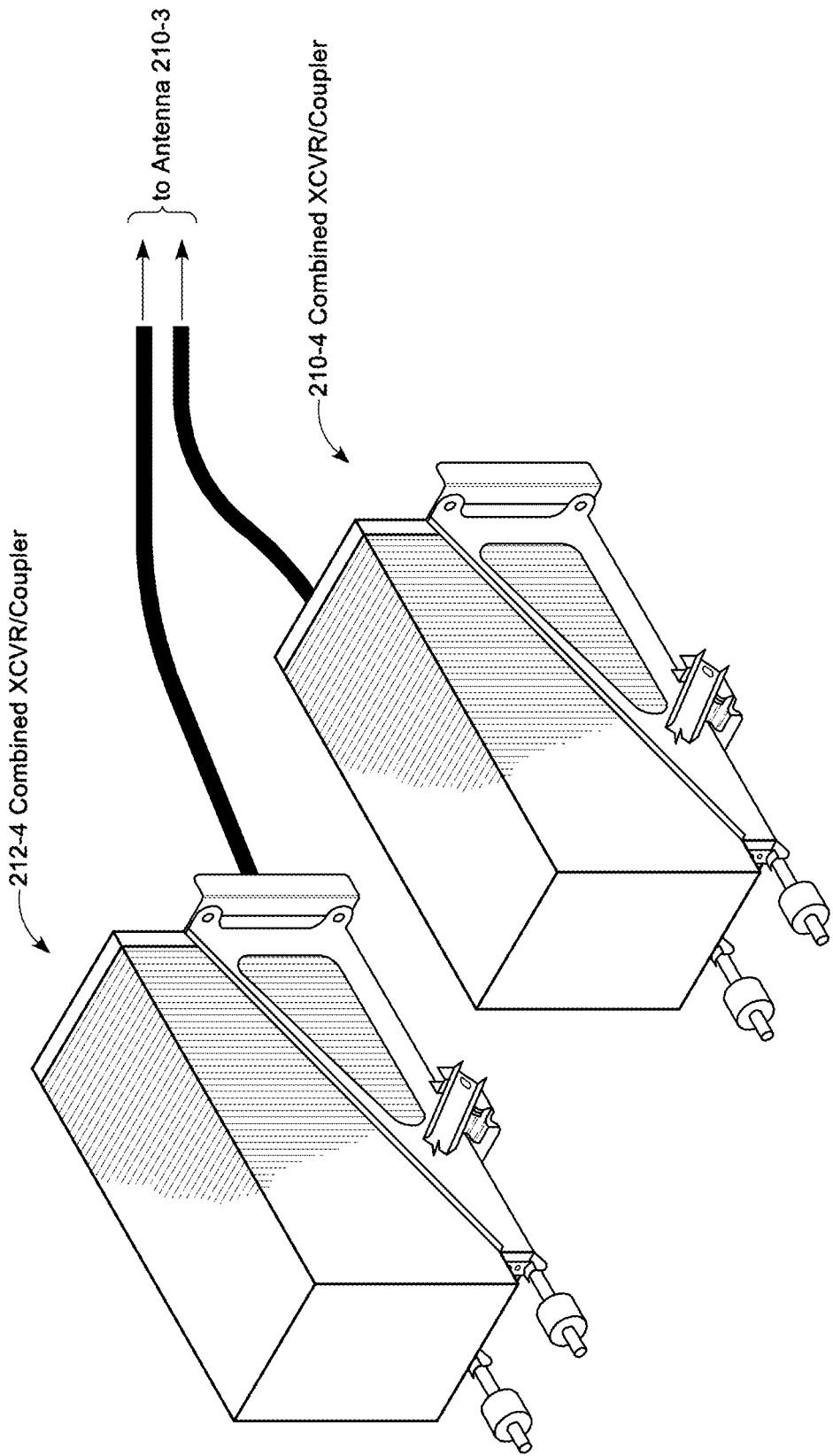
FIG. 6B depicts an exemplary embodiment of a configuration of combined units employed in remote HF communication systems.

Referring now to FIG. 6B, a combined XCVR/coupler 210-4 may replace the XCVR 210-1 and coupler 210-2, and a combined XCVR/coupler 212-4 may replace the XCVR 212-1 and coupler 212-2. As observed, two LRUs having different form factors have been replaced with one LRU designed having one form factor.

Figure 7A:
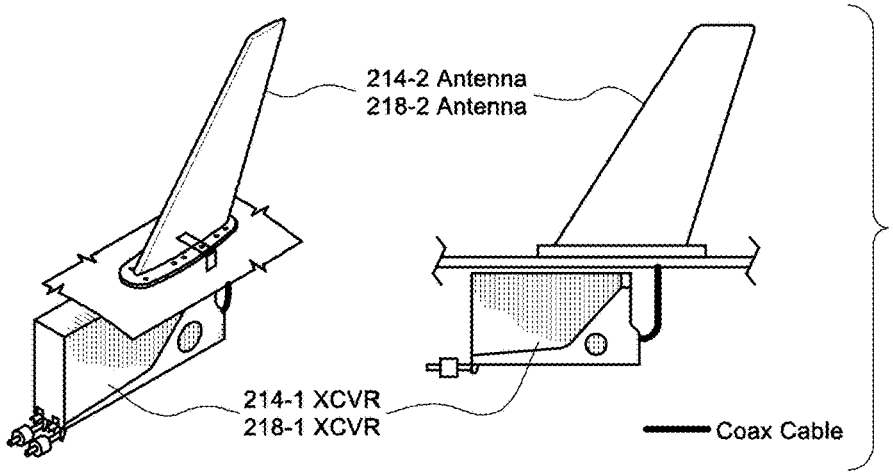
FIG. 7A depicts an exemplary embodiment of a configuration of units employed in remote VHF communication systems (top of the fuselage).
Figure 7B:
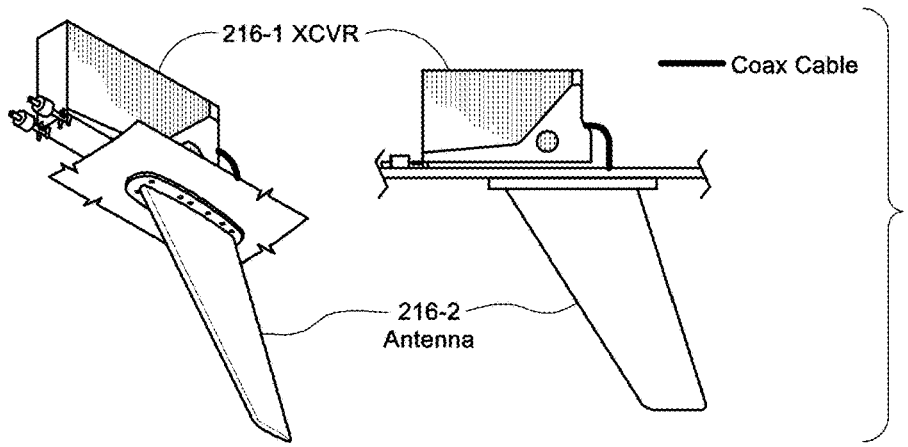
FIG. 7B depicts an exemplary embodiment of a configuration of units employed in a remote VHF communication system (bottom of the fuselage).

Referring now to FIGS. 7A and 7B, exemplary configurations of antenna-based installation of the XCVRs 214-1, 216-1, and 218-1 are illustrated. Here, the distances between the antennas 214-2, 216-2, and 218-2 and their respective XCVRs 214-1, 216-1, and 218-1 are less than the distance between these LRUs and the AMU 222 located in the E/E bay 226. As a result, the antenna-based installations of the XCVRs 214-1, 216-1, and 218-1 minimize the length of coax cable and cable losses, eliminating a need for amplifiers and more than one cable for the transmission of RF signals, or reducing the size of an amplifier due to a lower amount of amplification needed; additionally, smaller and lighter wires capable of permitting the transmission of digital communications data representative of VHF voice/data communications may run between the E/E bay 226 and XCVRs 214-1, 216-1, and 218-1.

Figure 8:
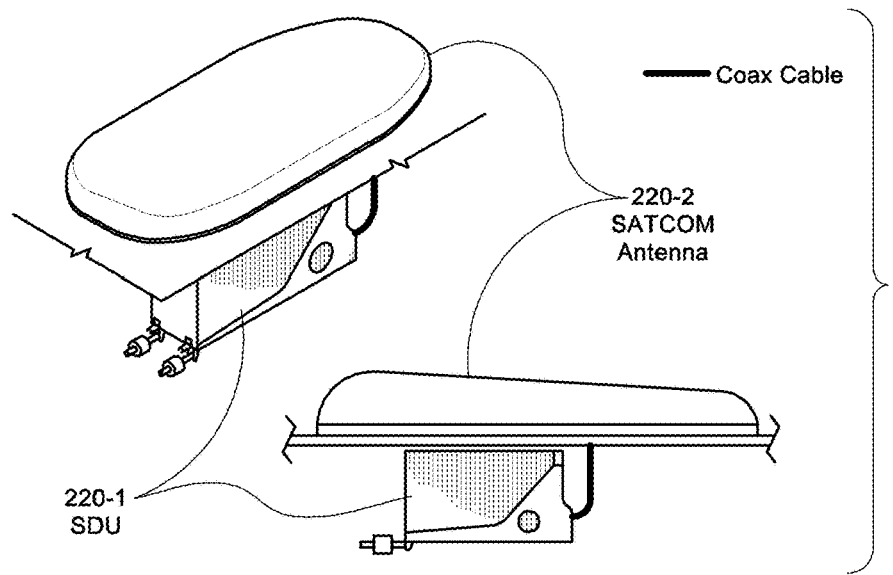
FIG. 8 depicts an exemplary embodiment of a configuration of units employed in a remote SATCOM system.

Referring now to FIG. 8, an exemplary configurations of antenna-based installation of the SDU 220-1 is illustrated. Here, the distance between the antenna 220-2 and the SDU 220-1 is less than the distance between this LRU and the AMU 222 located in the E/E bay 226. As a result, the antenna-based installation of the SDU 220-1 minimizes the length of coax cable and cable losses, eliminating a need for amplifiers and more than one cable for the transmission of RF signals, or reducing the size of an amplifier due to a lower amount of amplification needed; additionally, smaller and lighter wires capable of permitting the transmission of digital communications data representative of SATCOM voice/data communications may run between the E/E bay 226 and the SDU 220-1.

Although the preceding discussion has been drawn to the aircraft communication network 200 employing one or more remote communication systems, the inventive concepts disclosed herein are not limited to the aircraft communication network 200. Other systems such as, but not limited to, navigation and surveillance systems may receive and/or transmit RF signals remotely. Similar to the electronic LRUs of the aircraft communication network 200, the packaging or form factors of the electronic LRU(s) of navigation and/or surveillance system(s) may be designed to the size pursuant to an applicable ARINC standard to which the LRU has been operationally designed or reduced while still meeting the operational capabilities pursuant to an applicable ARINC standard.

Figure 9:
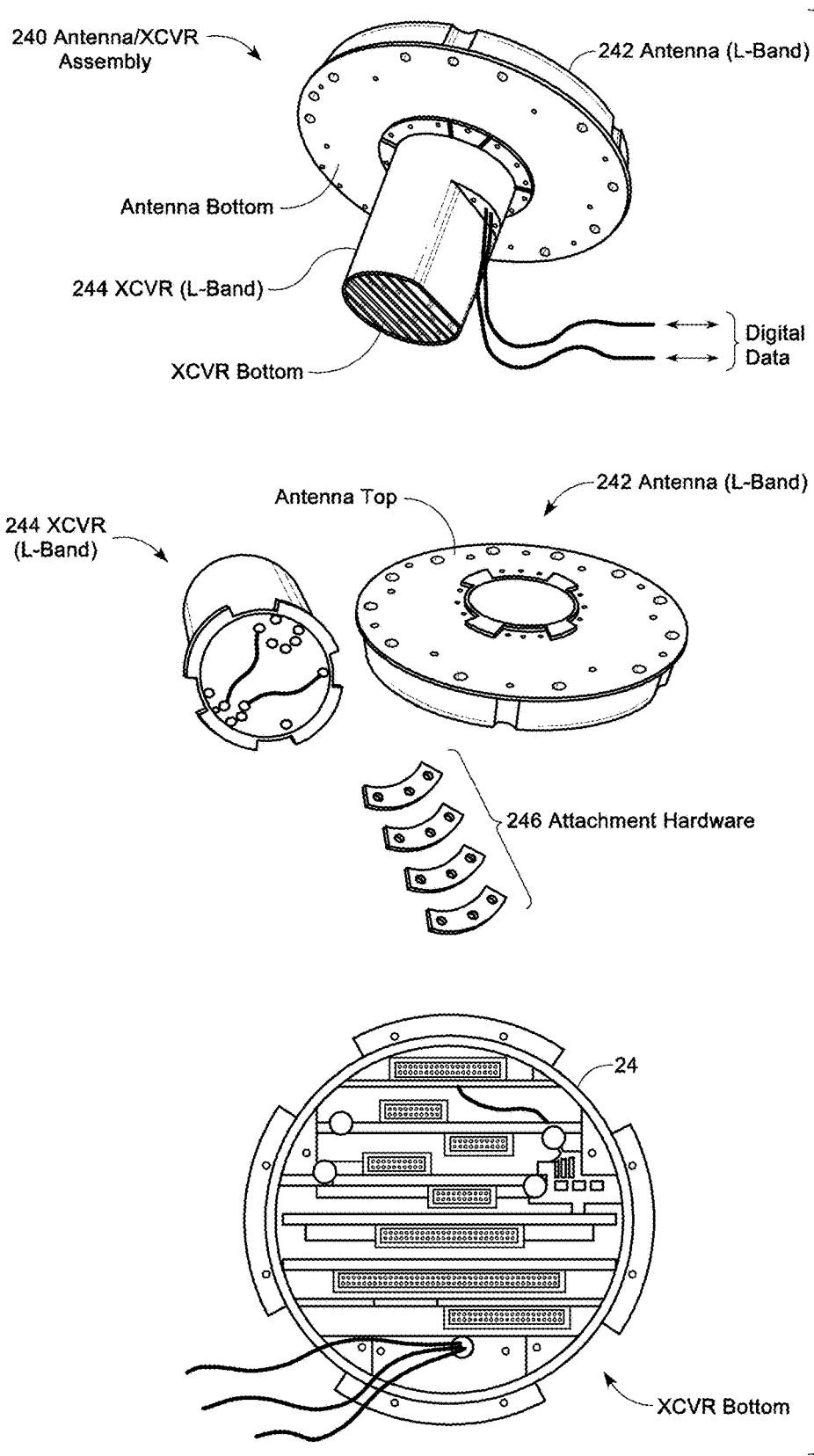
FIG. 9 depicts an exemplary embodiment of an antenna/XCVR assembly.

Referring now to FIG. 9, an exemplar of an antenna/XCVR assembly 240 is illustrated. The antenna/XCVR assembly 240 could include an antenna 242, a XCVR 244 which includes a DAC and ADC, and attaching hardware 246. Here, the antenna 242 could be exemplary of an L-band antenna employed, by example, navigation and/or surveillance systems. In some embodiments, the use of attaching hardware 246 may permit a detachment of the XCVR 244 from the antenna 242, permitting a mechanic to replace the XCVR 244 without removing the antenna 242 should the XCVR 244 become inoperative. In some embodiments, the antenna/XCVR assembly 240 may be fabricated as one unit.

As observed, there is an absence of coax cable. Also, the size of the XCVR is reduced, resulting in a reduction of aircraft weight. In addition, the packaging or form factor of the XCVR is cylindrical and not rectangular; that is, it is not designed to the applicable ARINC standard specific for the navigation or communication system employing the L-band antenna.

Figure 10:
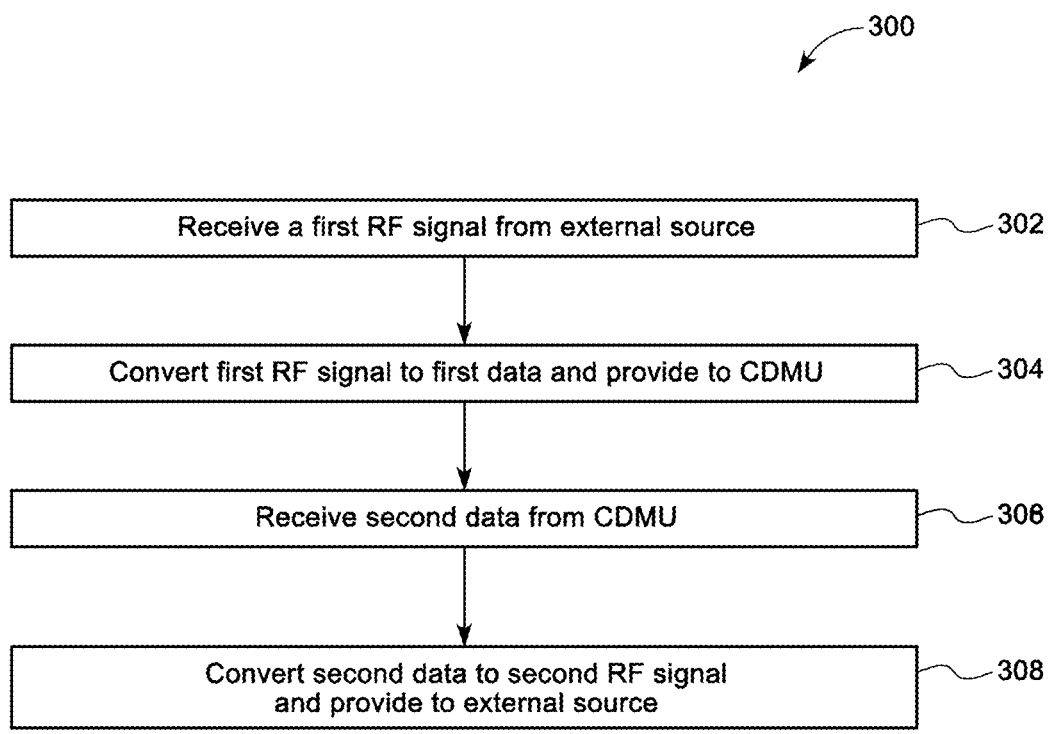
FIG. 10 illustrates a flowchart disclosing an embodiment of a method performed by an electronic LRU in an aircraft remote network.

FIG. 10 depicts flowchart 300 providing an example of a method employed in an aircraft remote network, where a remote system LRU such as the XCVR 210-1, 212-1, 214-1, 216-1, and 218-1 and the SDU 220-1 may be configured with a DAC and ADC may be programmed or configured with instructions corresponding to the following modules that that are continuously executed throughout the aircraft operation. The remote system LRU may be a processing unit(s) of a module such as, but not limited to, a printed circuit card assembly having one or more input interfaces (e.g., virtual or physical computer ports) to facilitate data communications with the remote system LRU, i.e., the receiving and providing of data (e.g., one or more electrical or optical signals including data and/or being indicative of data). For the accomplishment of the following modules embodied in FIG. 10, the acquiring of data is synonymous and/or interchangeable with reading, receiving, and/or the retrieval of data.

The method of flowchart 300 begins with module 302 with the remote system LRU receiving an RF signal representative of communications provided by a transmitter external to the aircraft via an antenna corresponding to the remote system. In some embodiments, the location where the remote system LRU is installed could be based upon the location of the antenna. In some embodiments, the remote system LRU and the antenna may be detachably connected to or integral with one another.

The method of flowchart 300 continues with module 304 with the remote system LRU converting the RF signal to communications data representative of communications with an ADC and providing the communications data to a centralized data management unit (CDMU). In some embodiments, the CDMU could include the AMU 222. In some embodiments, the distance between the remote system LRU and its corresponding antenna may be less than the distance between the remote system LRU and the CDMU.

The method of flowchart 300 continues with module 306 with the remote system LRU receiving communications data representative of communications from the CDMU. In some embodiments, the communications data could be further representative of RF tuning frequency to which the remote system LRU tunes.

The method of flowchart 300 continues with module 308 with the remote system LRU converting the communications data to RF signal representative of the communications with an ADC and providing the RF signal data to a receiver external to the aircraft via an antenna corresponding to the remote system. Then, the method of flowchart 300 ends.

It should be noted that the method steps described above may be embodied in computer-readable media stored in a non-transitory computer-readable medium as computer instruction code. It shall be appreciated to those skilled in the art that not all method steps described must be performed, nor must they be performed in the order stated.

As used herein, the term "embodiment" means an embodiment that serves to illustrate by way of example but not limitation.

It will be appreciated to those skilled in the art that the preceding examples and embodiments are exemplary and not limiting to the scope of the inventive concepts disclosed herein. It is intended that all modifications, permutations, enhancements, equivalents, and improvements thereto that are apparent to those skilled in the art upon a reading of the specification and a study of the drawings are included within the true spirit and scope of the inventive concepts disclosed herein. It is therefore intended that the following appended claims include all such modifications, permutations, enhancements, equivalents, and improvements falling within the true spirit and scope of the inventive concepts disclosed herein.

What is claimed is:

1. A remotely-managed radio frequency (RF) communication network of an aircraft, comprising:
a first structure comprised of a fuselage of an aircraft;
a second structure, other than the first structure, comprised of an aircraft passenger cabin having a ceiling and a plurality of rails located above the ceiling in a crown area of the aircraft and to which more than one cabin system component is mounted;
a centralized data management unit; and
an aircraft communication system comprised of an antenna and an electronic unit comprised of an analog-to-digital converter and a digital-to-analog converter for facilitating two-way communication between at least one pilot in the cockpit of the aircraft in flight and a source external to the aircraft, where
the electronic unit is configured to:
receive a first RF signal representative of a first voice/data communication from the source external to the aircraft via the antenna;
convert the first RF signal to first data representative of the first voice/data communication and provide the first data to the centralized data management unit;
receive second data representative of a second voice/data communication from the centralized data management unit; and
convert the second data to a second RF signal representative of the second voice/data communication and transmit the second RF signal to the source external to the aircraft via the antenna, where
the antenna is mounted to the first structure,
the electronic unit is mounted to at least one of the plurality of rails of the second structure, such that
the distance between the electronic unit and the antenna is less than the distance between the electronic unit and the centralized data management unit.

2. The network of claim 1, wherein a transmission line through which the first RF signal is received and the second RF signal is transmitted is a coaxial cable.

3. The network of claim 1, wherein the electronic unit conforms to ARINC Specification 836.

4. The network of claim 1, further comprising:
an equipment rack comprised of at least one shelf is installed in the aircraft, where
at least one shelf is comprised of a plurality of trays on which a plurality of line replaceable units are installable, and
the centralized data management unit is one of the line replaceable units installed on one tray.

5. The network of claim 1, wherein the antenna is mounted to the top of the fuselage.

6. The network of claim 1, wherein the antenna is mounted to the bottom of the fuselage.

7. The network of claim 1, wherein
the electronic unit is further configured to:
receive data representative of an RF tuning frequency from the centralized data management unit, and
tune the electronic unit to the RF frequency.

8. The network of claim 1, wherein the aircraft communication system is a high frequency communication system, a very high frequency communication system, or a satellite communication system.

9. A device employed in a remotely-managed radio frequency (RF) communication system of an aircraft, comprising:
   an electronic unit comprised of an analog-to-digital converter and a digital-to-analog converter for facilitating, in an aircraft communication system, two-way communication between at least one pilot in the cockpit of the aircraft and a source external to the aircraft, where the electronic unit is configured to:
      receive a first RF signal representative of a first voice/data communication from a source external to an aircraft via an antenna;
      convert the first RF signal to first data representative of the first voice/data communication and provide the first data to a centralized data management unit;
      receive second data representative of a second voice/data communication from the centralized data management unit; and
      convert the second data to a second RF signal representative of the second voice/data communication and transmit the second RF signal to the source external to the aircraft via the antenna, where
         a first structure is comprised of a fuselage,
         a second structure, other than the first structure, is comprised of an aircraft passenger cabin having a ceiling and a plurality of rails located above the ceiling in a crown area of the aircraft and to which more than one cabin system component is mounted,
         the antenna is mounted to the first structure,
         the electronic unit is mounted to at least one of the plurality of rails of the second structure, such that
            the distance between the electronic unit and the antenna is less than the distance between the electronic unit and the centralized data management unit.

10. The device of claim 9, wherein a transmission line through which the first RF signal is received and the second RF signal is transmitted is a coaxial cable.

11. The device of claim 9, wherein the electronic unit conforms to ARINC Specification 836.

12. The device of claim 9, wherein
   an equipment rack comprised of at least one shelf is installed in the aircraft, where
      at least one shelf is comprised of a plurality of trays on which a plurality of line replaceable units are installable, and
      the centralized data management unit is one of the line replaceable units installed on one tray.

13. The device of claim 9, wherein the antenna is mounted to the top of the fuselage.

14. The device of claim 9, wherein the antenna is mounted to the bottom of the fuselage.

15. A method employed in a remotely-managed radio frequency (RF) communication system of an aircraft, comprising:
   receiving, by an electronic unit comprised of an analog-to-digital converter and a digital-to-analog converter for facilitating, in an aircraft communication system, two-way communication between at least one pilot in the cockpit of the aircraft and a source external to the aircraft, a first RF signal representative of a first voice/data communication from a source external to an aircraft via an antenna;
   converting the first RF signal to first data representative of the first voice/data communication and provide the first data to a centralized data management unit;
   receiving second data representative of a second voice/data communication from the centralized data management unit; and
   converting the second data to a second RF signal representative of the second voice/data communication and transmit the second RF signal to the source external to the aircraft via the antenna, where
      a first structure is comprised of a fuselage,
      a second structure, other than the first structure, is comprised of an aircraft passenger cabin having a ceiling and a plurality of rails located above the ceiling in a crown area of the aircraft and to which more than one cabin system component is mounted,
      the antenna is mounted to the first structure, and
      the electronic unit is mounted to at least one of the plurality of rails of the second structure, such that
         the distance between the electronic unit and the antenna is less than the distance between the electronic unit and the centralized data management unit.

16. The method of claim 15, wherein a transmission line through which the first RF signal is received and the second RF signal is transmitted is coaxial cable.

17. The method of claim 15, wherein the electronic unit conforms to ARINC Specification 836.

18. The method of claim 15, wherein
   an equipment rack comprised of at least one shelf is installed in the aircraft, where
      at least one shelf is comprised of a plurality of trays on which a plurality of line replaceable units are installable, and
      the centralized data management unit is one of the line replaceable units installed on one tray.

19. The method of claim 15, wherein the antenna is mounted to the top of the fuselage.

20. The method of claim 15, wherein the antenna is mounted to the bottom of the fuselage.

* * * * *